US012796511B2

(12) United States Patent
Kim et al.

(10) Patent No.: US 12,796,511 B2
(45) Date of Patent: Nov. 10, 2026

(54) SEMICONDUCTOR PACKAGE WITH IMPROVED SPACE UTILIZATION AND METHOD FOR MAKING THE SAME

(71) Applicant: STATS ChipPAC Pte. Ltd., Singapore (SG)

(72) Inventors: Gwang Kim, Gyeongi-do (KR); HunTeak Lee, Gyeonggi-do (KR)

( * ) Notice: Subject to any disclaimer, the term of this patent is extended or adjusted under 35 U.S.C. 154(b) by 358 days.

(21) Appl. No.: 18/582,697

(22) Filed: Feb. 21, 2024

(65) Prior Publication Data

US 2024/0290671 A1 Aug. 29, 2024

(30) Foreign Application Priority Data

Feb. 24, 2023 (CN) ......................... 202310185065.7

(51) Int. Cl.
*H10W 70/68* (2026.01)
*H10W 42/60* (2026.01)
(Continued)

(52) U.S. Cl.
CPC ........... *H10W 70/68* (2026.01); *H10W 42/60* (2026.01); *H10W 44/20* (2026.01); *H10W 70/05* (2026.01); *H10W 70/095* (2026.01); *H10W 70/099* (2026.01); *H10W 70/685* (2026.01); *H10W 74/124* (2026.01); *H10W 90/00* (2026.01); *H10W 44/248* (2026.01)

(58) Field of Classification Search
CPC .. H10W 70/68; H10W 70/682; H10W 74/124
See application file for complete search history.

(56) References Cited

U.S. PATENT DOCUMENTS 10,340,235 B2 7/2019 Hsu et al.
10,734,704 B2 8/2020 Ho et al.
(Continued)

FOREIGN PATENT DOCUMENTS

CN 105895623 A 8/2016
CN 111383925 A 7/2020
(Continued)

*Primary Examiner* — Daniel Luke

(74) *Attorney, Agent, or Firm* — Junhe Law Office P. C.; Yi Zhang

(57) ABSTRACT

A semiconductor package comprises: a package substrate comprising: a first portion comprising a first conductive pattern extending therewithin having a first thickness; and a second portion comprising a second conductive pattern extending therewithin having a second thickness smaller than the first thickness; at least one electronic component mounted on the second portion and electrically coupled to the second conductive pattern; an encapsulant layer formed on the second portion of the package substrate and covering the at least one electronic component, wherein the encapsulant layer comprises a cavity region; a connector assembly formed within the cavity region of the encapsulant layer and electrically coupled to the second conductive pattern, wherein the connector assembly is exposed from the encapsulant layer to allow for electrical connection with an external device; and a partial shielding layer formed on at least regions other than the cavity region of the encapsulant layer.

19 Claims, 14 Drawing Sheets

(51) Int. Cl.

| | |
|---|---|
| ***H10W 44/20*** | (2026.01) |
| ***H10W 70/00*** | (2026.01) |
| ***H10W 70/05*** | (2026.01) |
| ***H10W 70/685*** | (2026.01) |
| ***H10W 74/10*** | (2026.01) |
| ***H10W 90/00*** | (2026.01) |

(56) References Cited

U.S. PATENT DOCUMENTS

| | | | | |
|---|---|---|---|---|
| 10,985,109 | B2 * | 4/2021 | Kim | H01R 12/52 |
| 11,705,383 | B2 * | 7/2023 | Nickerson | H10W 20/20 257/774 |
| 11,876,029 | B2 * | 1/2024 | Iwamoto | H05K 3/46 |
| 2005/0017347 | A1 | 1/2005 | Morimoto et al. | |
| 2018/0211926 | A1 | 7/2018 | Jang et al. | |
| 2019/0103365 | A1 | 4/2019 | Singh et al. | |
| 2021/0366838 | A1 | 11/2021 | Han et al. | |
| 2022/0246533 | A1 | 8/2022 | Cho et al. | |
| 2022/0375884 | A1 | 11/2022 | You | |
| 2023/0178508 | A1 * | 6/2023 | Vincent | H10W 42/20 438/107 |

FOREIGN PATENT DOCUMENTS

| | | | |
|---|---|---|---|
| CN | 213662042 | U | 7/2021 |
| TW | 202006919 | A | 2/2020 |

* cited by examiner

SEMICONDUCTOR PACKAGE WITH IMPROVED SPACE UTILIZATION AND METHOD FOR MAKING THE SAME

TECHNICAL FIELD

The present application generally relates to semiconductor devices, and more particularly, to a semiconductor package and a method for making the same.

BACKGROUND OF THE INVENTION

The semiconductor industry is constantly faced with complex integration challenges as consumers want their electronics to be smaller, faster and higher performance with more and more functionality packed into a single device. One of the solutions is Antenna-in-Package (AiP). AiP is a functional electronic system or sub-system that integrates semiconductor system and antenna(s) into one package.

This invention provides a new structure of AiP with improved space utilization and reduced thickness.

SUMMARY OF THE INVENTION

An objective of the present application is to provide a semiconductor package with improved space utilization and reduced thickness.

According to an aspect of the present application, a semiconductor package is provided. The semiconductor package comprises: a package substrate comprising: a first portion comprising a first conductive pattern extending therewithin, wherein the first portion of the package substrate has a first thickness; and a second portion comprising a second conductive pattern extending therewithin, wherein the second portion of the package substrate has a second thickness smaller than the first thickness; at least one electronic component mounted on the second portion of the package substrate and electrically coupled to the second conductive pattern; an encapsulant layer formed on the second portion of the package substrate and covering the at least one electronic component, wherein the encapsulant layer comprises a cavity region; a connector assembly formed within the cavity region of the encapsulant layer and electrically coupled to the second conductive pattern, wherein the connector assembly is exposed from the encapsulant layer to allow for electrical connection with an external device; and a partial shielding layer formed on at least regions other than the cavity region of the encapsulant layer.

According to another aspect of the present application, a method for forming a semiconductor package is provided. The method comprises: forming a package substrate that includes: a first portion comprising a first conductive pattern extending therewithin, wherein the first portion of the package substrate has a first thickness; and a second portion comprising a second conductive pattern extending therewithin, wherein the second portion of the package substrate has a second thickness smaller than the first thickness; mounting at least one electronic component on the second portion of the package substrate, wherein the at least one electronic component is electrically coupled to the second conductive pattern; forming an encapsulant layer on the second portion of the package substrate, wherein the encapsulant layer includes a cavity region and covers the at least one electronic component; mounting a connector assembly within the cavity region of the encapsulant layer, wherein the connector assembly is electrically coupled to the second conductive pattern and is exposed from the encapsulant layer to allow for electrical connection with an external device; forming a partial shielding layer on at least regions other than the cavity region of the encapsulant layer.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

FIGS. 6A to 6G-2 are cross-sectional views illustrating various steps for making a semiconductor package according to an embodiment of the present application.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
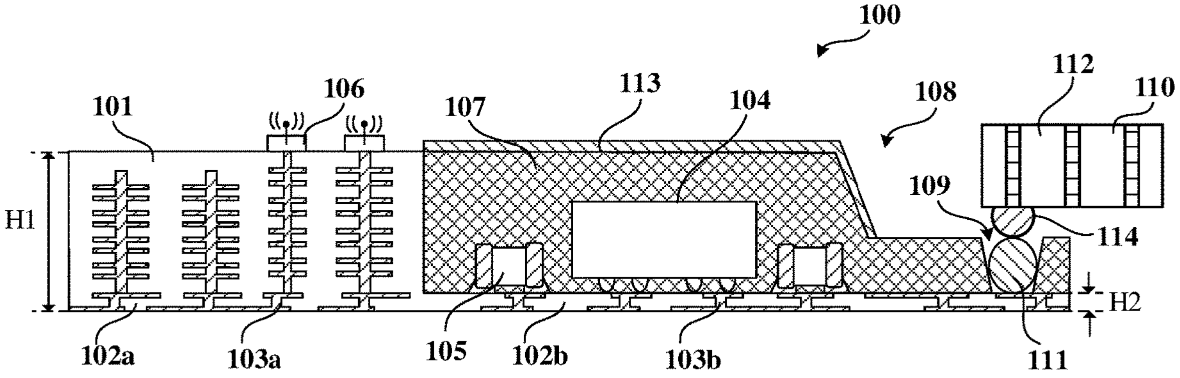
FIG. 1 is a cross-sectional view illustrating a semiconductor package according to an embodiment of the present application.

FIG. 1 is a cross-sectional view illustrating a semiconductor package 100 according to an embodiment of the present application. As shown in FIG. 1, the semiconductor package 100 includes a package substrate 101 which may include a first portion 102*a* and a second portion 102*b*. In the embodiment shown in FIG. 1, the first portion 102*a* and the second portion 102*b* are integrated with each other, i.e., the package substrate 101 is of an integral structure including the first portion 102*a* and the second portion 102*b*, which can be formed from a multi-layer stack structure using the process shown in FIGS. 9A to 9I, which will be discussed in detail below. As can be seen, the first portion 102*a* of the package substrate 100 has a first thickness H1 and the second portion 102*b* has a second thickness H2, and the second thickness H2 is less than the first thickness H1. The second portion 102*b* with the reduced thickness H2 creates a cavity within the semiconductor package 100, where various electronic components may be mounted. In this way, a total thickness of the semiconductor package 100 may not be increased even if the electronic components are mounted on the package substrate 101, especially when a thickness of the electronic component is less than a depth of the cavity above the second portion 102*b*. In some embodiments, the package substrate 101 may be a multi-layer structure, and the multi-layer structure may include multiple insulating or passivation layers and multiple conductive layers formed over or between the insulating layers. The package substrate 101 may include one or more laminated layers of polytetrafluoroethylene pre-impregnated, FR-4, FR-1, CEM-1, or CEM-3 with a combination of phenolic cotton paper, epoxy, resin, woven glass, matte glass, polyester, and other reinforcement fibers or fabrics. The insulating layers may contain one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. The package substrate 101 can also be a multi-layer flexible laminate, ceramic, copper clad laminate, glass, or semiconductor wafer including an active surface containing one or more transistors, diodes, and other circuit elements to implement analog circuits or digital circuits. The package substrate 101 may include one or more electrically conductive layers or redistribution layers (RDL) formed using sputtering, electrolytic plating, electroless plating, or other suitable deposition process.

In the embodiment shown in FIG. 1, the conductive layers of the package substrate 101 may be patterned and interconnected through vias, such that conductive patterns may be formed within the package substrate 101, as desired. For example, one or more first conductive patterns 103*a* may be formed which extend within the first portion 102*a* of the package substrate 101, and one or more second conductive patterns 103*b* may be formed which extend within the second portion 102*b* of the package substrate 100. In some embodiments, at least a portion of the first conductive patterns 103*a* may be electrically connected with at least a portion of the second conductive patterns 103*b*, to allow for further connection between the at least a portion of the first conductive patterns 103*a* and electronic components mounted on the second portion 102*b*, as elaborated below. In some embodiments, one or more of the first conductive patterns 103*a* may be formed as antennas capable of receiving and transmitting radio signals, and the other one or more of the first conductive patterns 103*a* may be formed as wiring which mainly serves for electrical connection.

One or more electronic components such as a semiconductor die or a smaller semiconductor package 104 or a discrete component 105 can be mounted on the second portion 102*b* of the package substrate 100, and the one or more electronic components 104 or 105 are electrically coupled to the second conductive pattern 103*b* in the second portion 102*b*. As mentioned above, the electronic components 104 or 105 may be electrically coupled to the first conductive patterns 103*a* such as antennas through the second conductive pattern 103*b*, thereby forming an Antenna-in-Package structure. Alternatively, one or more surface-mounted antennas 106 can be mounted on the first portion 102*a* of the package substrate 100, and electrically coupled to the first conductive patterns 103*a* within the first portion 102*a*. As such, the semiconductor system and antenna(s) are integrated into one package in another manner. It can be appreciated that the position of the antennas with respect to the package substrate 101 can be changed as desired. For example, the antennas may be formed under the package substrate 101, that is, the antennas and the electronic components may be disposed on two opposite sides of the package substrate 101. In some embodiments, the built-in antennas formed of the first conductive patterns 103*a* within the first portion 102*a* may be preferable because they may not increase the thickness of the entire semiconductor package 100.

The semiconductor package 100 is shown in FIG. 1 only for illustration purpose, and those skilled in the art can appreciate that the semiconductor packages according to the embodiments of the present application may include more electronic components, or may include less electronic components. In some embodiments, the semiconductor die 104 may be a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc. The discrete components 105 may be one or more passive electrical components such as resistors, capacitors, inductors, etc. In some embodiments, the semiconductor components 104, the discrete components 105 and/or the surface-mounted antennas 106 may be mounted onto the package substrate 101 using any suitable surface mounting techniques.

As shown in FIG. 1, the electronic components such as the semiconductor die 104 or the discrete components 105 are encapsulated by an encapsulant layer 107. The encapsulant layer 107 is formed on the second portion 102*b* of the package substrate 101 and covers the electronic components. The encapsulant layer 107 may be made of a polymer composite material such as epoxy resin with filler, epoxy acrylate with filler, or polymer with proper filler, for example, to provide protection for the electronic components from external environment, shocks and/or contaminants. In some embodiments, the encapsulant layer 107 may include high-K Electromagnetic Compatibility (EMC) for antenna performance.

The encapsulant layer 107 may include a cavity region 108, and the encapsulant layer 107 has a decrescent thickness at the cavity region 108. In one embodiment, the encapsulant layer 107 is formed using a step molding process to form the cavity region 108. In the embodiment as shown in FIG. 1, one or more via holes 109 may be further formed through the cavity region 108 of the encapsulant layer 107, for example, using laser ablation. The via holes 109 can exposed some of the conductive patterns in the second portion 102*b* from the encapsulant layer 107. A connector assembly 110 is further formed within the cavity region 108 of the encapsulant layer 107. In this embodiment, the connector assembly 110 includes at least one solder ball 111 that is mounted in the via hole 109 formed through the cavity region 108. The solder ball 111 of the connector assembly 110 can be mounted in the via hole 109 through solder paster, for example.

The connector assembly 110 may further includes connector 112 that is mounted onto and electrically coupled with the solder ball 111, for example, through another solder ball 114. In some embodiments, the connector 112 may take form of a block or panel with multi-layered conductive posts. The block or panel of the e-bar can be made of one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide, benzocyclobutene (BCB), polybenzoxazoles (PBO), and other material having similar insulating and structural properties. The block or panel of the e-bar connector can also be a multi-layer flexible laminate, ceramic, copper clad laminate, glass, epoxy molding compound, or semiconductor wafer. In another embodiment, the connector 112 can also be any suitable laminate interposer, PCB, wafer-form, strip interposer, leadframe, or other type of substrate. For example, the connector 12 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. The connector 112 or particularly the conductive posts thereof can be one or more layers of Al, Cu, Sn, Ni, Au, Ag, or other suitable electrically conductive material, and can be formed using PVD, CVD, electrolytic plating, electroless plating process, or other suitable metal deposition process. In some embodiments, the connector 112 can be performed as a single piece so that it can be easily mounted onto the solder ball 111.

It can be seen that the connector assembly 110 may be exposed from the encapsulant layer 107 and electrically coupled to the second conductive pattern 103*b* through the solder ball 111. In this way, the circuitry within the semiconductor package 100 can be electrically coupled to an external device via the connector assembly 110. In some embodiments, the connector assembly 110 may be further integrated with the other components of the semiconductor package 110, through for example another encapsulant or adhesive material.

In the embodiment shown in FIG. 1, a shielding layer 113 is deposited on the encapsulant layer 107 to shield electromagnetic interface (EMI) induced to or generated by the electronic components such as the semiconductor die 104 and the discrete components 105 encapsulated by the encapsulant layer 107. In particular, the shielding layer 113 may at least be formed on at least the regions of the encapsulant layer 107, that is, only not formed on the cavity region 108. The shielding layer 113 may be made of a conductive material and may be electrically connected to the ground of the semiconductor package 100. The shielding layer 113 may not cover the connector assembly 110 which is desired to be connected to external devices for signal inputting/outputting purpose. In some embodiments, the shielding layer 113 may further extend from the encapsulant layer 107 on the second portion 102*b* to the first portion 102*a* of the package substrate 101, to cover for example at least some of the conductive patterns 103*a* as desired.

With the second portion 102*b* with a reduced thickness than the first portion 102*a*, the electronic components such as the semiconductor die 104 or the discrete components 105 can be mounted on the package substrate 101 without increasing the total thickness of the semiconductor package 100. In addition, with the cavity region 108 of the encapsulant layer 107, the connector assembly 110 can also be mounted on the package substrate 101 without increasing the total thickness of the semiconductor package 100, since the cavity region 108 allows for a space for the connector assembly 110 substantially below a top surface of the package substrate 101. As a result, the semiconductor package 100 can be formed in a more compact form, with improved space utilization and a reduced thickness.

Figure 2:
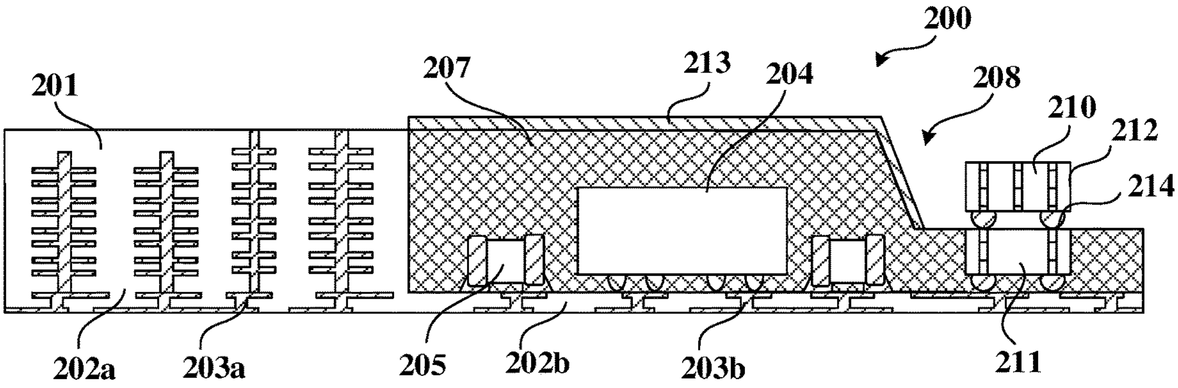
FIG. 2 is a cross-sectional view illustrating a semiconductor package according to another embodiment of the present application.

FIG. 2 is a cross-sectional view illustrating a semiconductor package 200 according to another embodiment of the present application. Different from the semiconductor package 100 shown in FIG. 1, the semiconductor package 200 utilizes another connector assembly structure as detailed below.

As shown in FIG. 2, the semiconductor package 200 includes an integral package substrate 201 which may include a first portion 202*a* and a second portion 202*b*. A first conductive pattern 203*a* is formed within the first portion 202*a*, and a second conductive pattern 203*b* is formed within the second portion 202*b*. One or more electronic components such as a semiconductor die 204 or a discrete component 205, an encapsulant layer 207 with a cavity region 208, and a shielding layer 213 can be mounted or formed on the package substrate 201, which are similar as those included in the semiconductor package 100 shown in FIG. 1 and thus will not be repeated herein.

As shown in FIG. 2, different from the semiconductor package 100, the cavity region 208 of the encapsulant layer 207 includes a connector assembly 210 which is generally formed by an e-bar connector 211 that is directly mounted on the second portion 202*b* of the package substrate 201 and electrically coupled with the second conductive pattern 203*b* through solder balls, for example. The e-bar connector 211 can also be encapsulated by the encapsulant layer 207. The e-bar 211 may take form of a block or panel with multi-layered conductive posts, similar as the e-bar connector 112 illustrated in FIG. 1. The e-bar connector 211 allows for forming the conductor assembly or at least a portion of the connector assembly on the package substrate 101 prior to the forming of the encapsulant layer 207, thus simplifying the process of making the semiconductor package 200. The connector assembly 210 may further include another connector such as another e-bar connector 212, which can be mounted onto the e-bar connector 211. In this way, the connector assembly 210 can be exposed from the encapsulant layer 207 and is electrically coupled to the second conductive pattern 203*b*.

Figure 3:
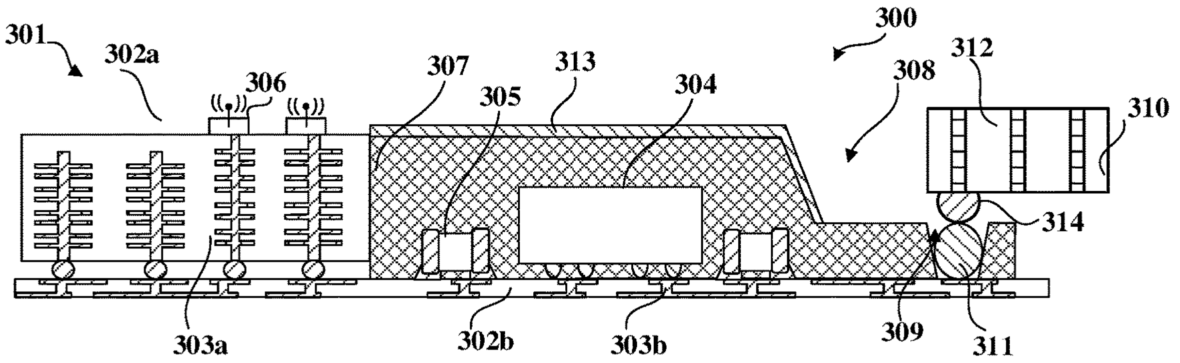
FIG. 3 is a cross-sectional view illustrating a semiconductor package according to another embodiment of the present application.

FIG. 3 is a cross-sectional view illustrating a semiconductor package 300 according to another embodiment of the present application. Different from the semiconductor package 100 shown in FIG. 1, the semiconductor package 300 includes a non-integral package substrate, which will be illustrated below.

As shown in FIG. 3, the semiconductor package 300 also includes one or more electronic components such as a semiconductor die 304 or a discrete component 305, an encapsulant layer 307 with a cavity region 308 and a via 309, a connector assembly 310 and a shielding layer 313, which are similar as those included in the semiconductor package 100 shown in FIG. 1 and thus will not be repeated herein.

As shown in FIG. 3, different from the semiconductor package 100, the semiconductor package 300 includes a non-integral package substrate 301 that has a first portion 302*a* and a second portion 302*b*, and the first portion 302*a* and the second portion 302*b* are separately formed and then connected with each other. As can be seen, the first portion 302*a* is attached and electrically coupled to the second portion 302*b*, for example, through a surface mounted technology (SMT) via solder balls. The first portion 302*a* includes one or more first conductive patterns 303*a*, and the second portion 302*b* includes one or more second conductive patterns 303*b*. The first conductive patterns 303*a* and the second conductive patterns 303*b* are similar as those shown in FIG. 1 and thus will not be repeated herein.

Figure 4:
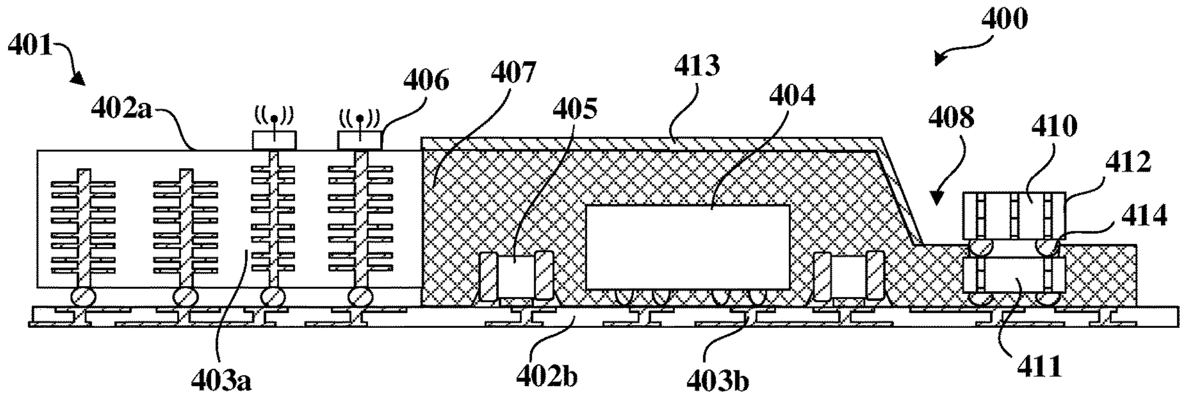
FIG. 4 is a cross-sectional view illustrating a semiconductor package according to another embodiment of the present application.

FIG. 4 is a cross-sectional view illustrating a semiconductor package 400 according to another embodiment of the present application. The semiconductor package 400 includes components similar as those in the semiconductor package 200 shown in FIG. 2.

As shown in FIG. 4, the semiconductor package 400 also includes one or more electronic components such as a semiconductor die 404 or a discrete component 405, an encapsulant layer 407 with a cavity region 408, a connector assembly 410 and a shielding layer 413, which are similar as those included in the semiconductor package 200 shown in FIG. 2 and thus will not be repeated herein.

As shown in FIG. 4, different from the semiconductor package 200, the semiconductor package 400 includes a non-integral package substrate 401 that has a first portion 402*a* and a second portion 402*b* separated, and the first portion 402*a* and the second portion 402*b* are separately formed and then connected with each other. As can be seen, the first portion 402*a* is attached and electrically coupled to the second portion 402*b*, for example, through a surface mounted technology (SMT) via solder balls. The first portion 402*a* includes one or more first conductive patterns 403*a*, and the second portion 402*b* includes one or more second conductive patterns 403*b*. The first conductive patterns 403*a* and the second conductive patterns 403*b* are similar as those shown in FIG. 1 to FIG. 3 and thus will not be repeated herein. Furthermore, a bottom portion (i.e., the e-bar connector 411) of the connector assembly 410 is embedded within the encapsulant layer 407 and exposed by removing the portion of encapsulant layer 407 covering it, such that the bottom portion 411 can be connected with a top portion (i.e., the e-bar connector 412) of the connector assembly 410 through multiple bumps 414.

Figure 5:
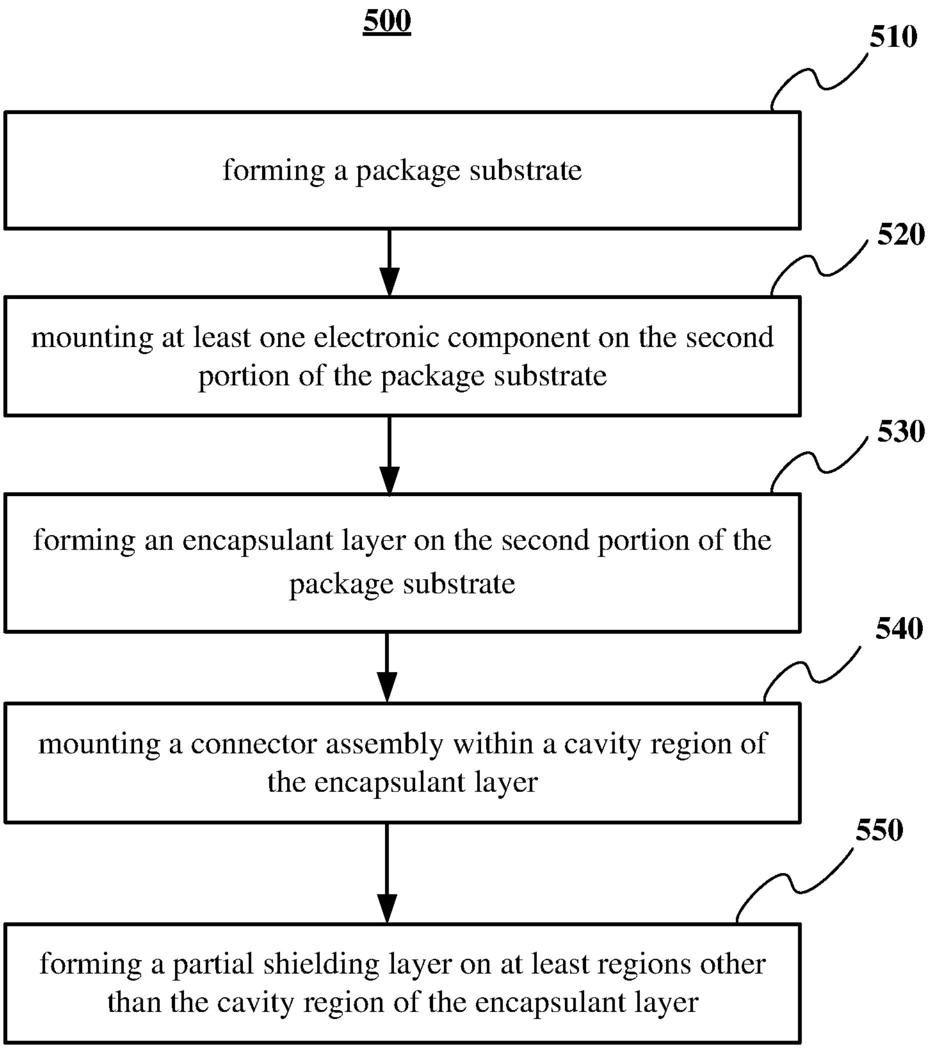
FIG. 5 is a flow char illustrating a method for forming a semiconductor package according to an embodiment of the present application.

FIG. 5 is a flow chart illustrating a method 500 for forming a semiconductor package illustrated according to an embodiment of the present application, for example, for forming the semiconductor package 100 as shown in FIG. 1 or the semiconductor package 200 as shown in FIG. 2, or forming a semiconductor package 600 as shown in FIG. 6 or a semiconductor package 700 as shown in FIG. 7 below.

In particular, the method 500 may start with providing a package substrate. The package substrate may be formed using a process illustrated in FIGS. 9A to 9I which will be described with more details below.

Next, the method 500 proceeds with step 520, and at least one electronic component is mounted on the second portion of the package substrate.

After mounting the various components on the package substrate, the method 500 proceeds with step 530, and an encapsulant layer is formed on the second portion of the package substrate.

The method 500 includes step 540, and a connector assembly is mounted within a cavity region of the encapsulant layer.

And, the method 500 includes a step 550: a shielding layer is formed on at least regions other than the cavity region of the encapsulant layer.

Figure 6A:
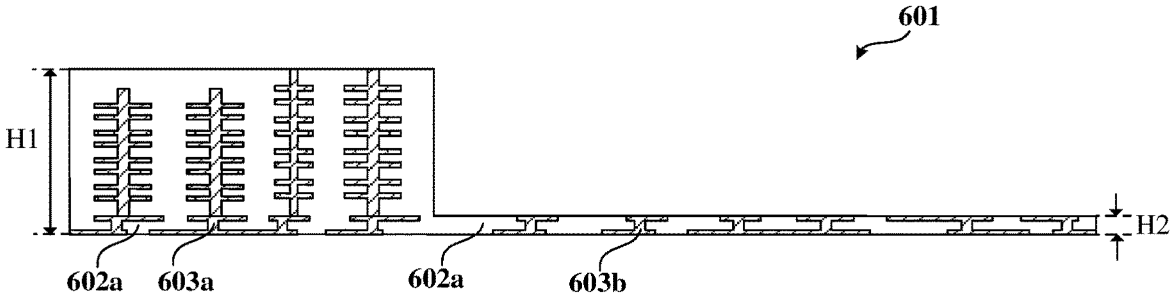
Figure 6B:
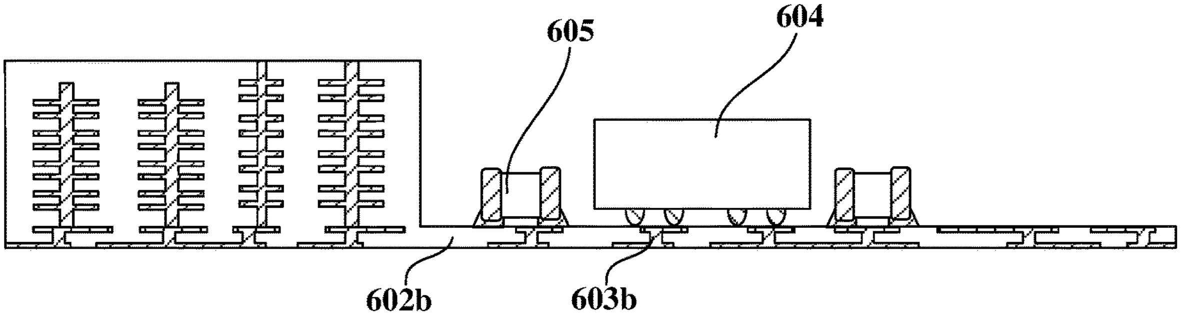
Figure 6C:
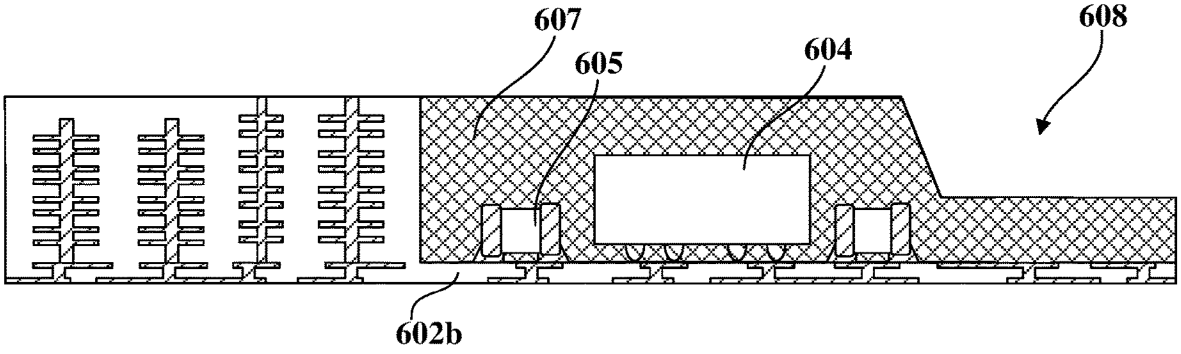
Figures 1, 6D:
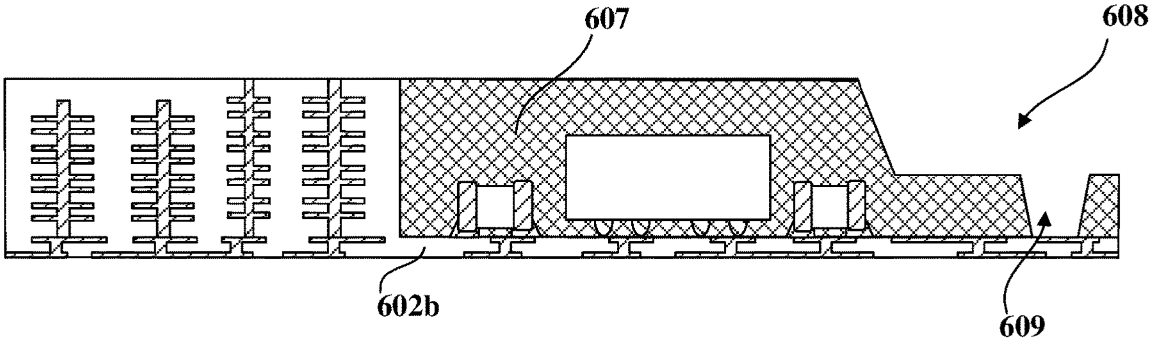
Figures 2, 6D:
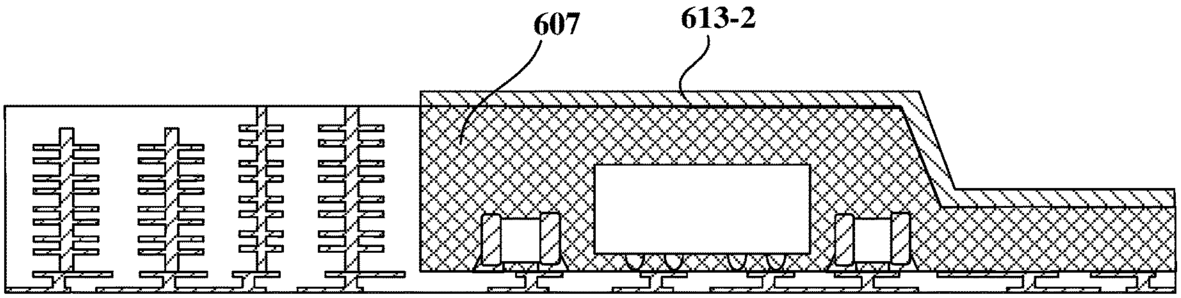
Figures 2, 6E:
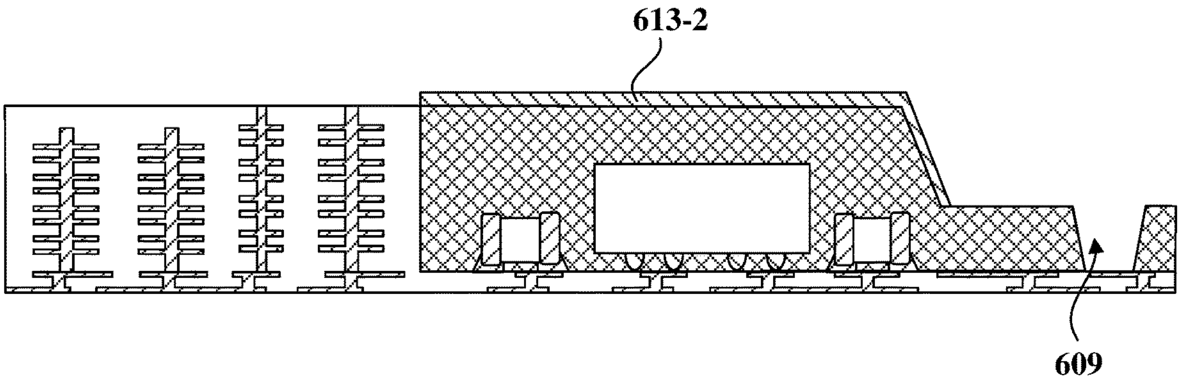
Figures 2, 6F:
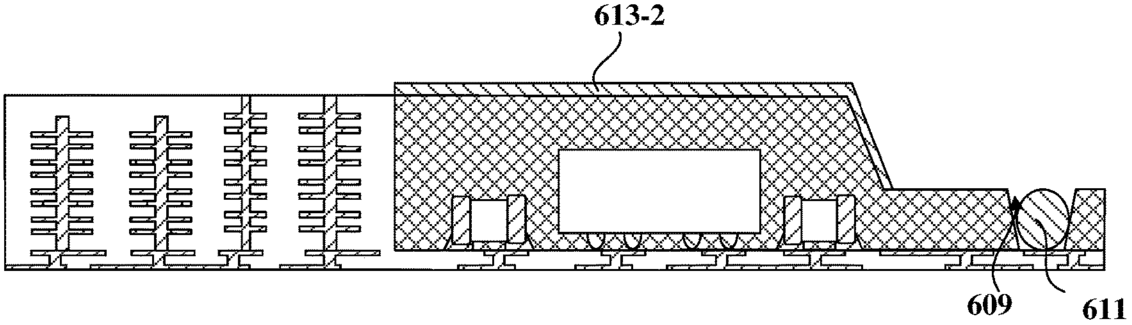
Figures 1, 6E:
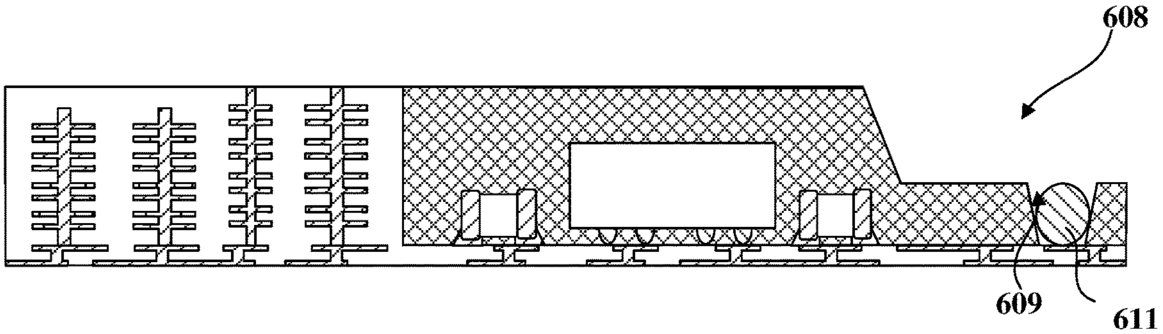
Figures 1, 6F:
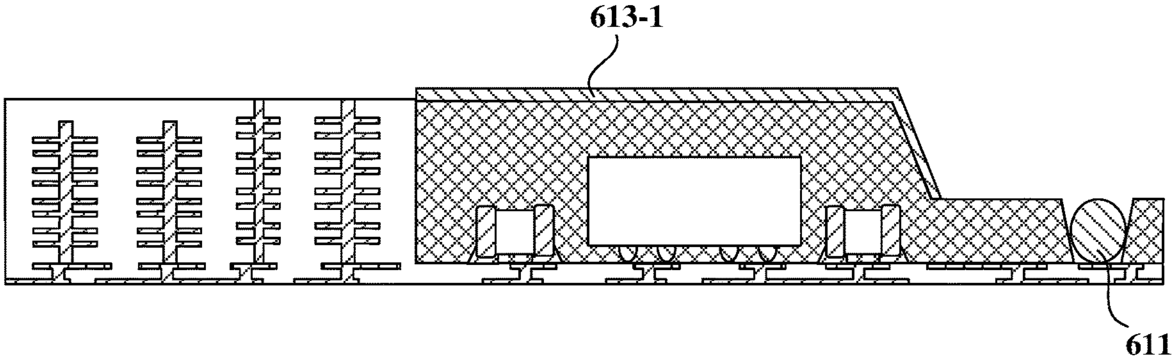

FIGS. 6A to 6G-2 are cross-sectional views illustrating various steps for forming a semiconductor package 600 illustrated according to an embodiment of the present application. The steps of the method 500 will be discussed in detail with reference to FIGS. 6A to 6G-2. Those skilled in the art can understand that an array of semiconductor packages 600 can be formed at the same time, and FIGS. 6A to 6G-2 show how one semiconductor package 600 is formed. When forming the array of semiconductor packages 600, each semiconductor package 600 can be singulated from the array. For example, each semiconductor package 600 can be singulated from the array before a shielding layer 613 (as shown in FIG. 6F) is formed.

As shown in FIG. 6A, a package substrate 601 is first provided. The package substrate 601 includes a first portion 602*a* with a first conductive pattern 603*a* extending therewithin, and a second portion 602*b* with a second conductive pattern 603*b* extending therewithin. The second portion 602*b* of the package substrate 601 has a second thickness H2 that is less than the first thickness H1 of the first portion 602*a* of the package substrate 601.

As shown in FIG. 6B, at least one electronic component such as a semiconductor die 604 and a discrete component 605 is mounted on the second portion 602*b* of the package substrate 600. The electronic components 604 and 605 are electrically coupled to the second conductive pattern 603*b*.

As shown in FIG. 6C, an encapsulant layer 607 is formed on the second portion 602*b* of the package substrate. The encapsulant layer 607 may be formed using a step molding process to form a cavity region 608. The encapsulant layer 607 covers at least the electronic components such as the semiconductor die 604 and the discrete component 605. In some embodiments, the encapsulant layer 607 may include high-K Electromagnetic Compatibility (EMC) for antenna performance.

In some embodiments, after the encapsulant layer 607 is formed on the second portion 602*b* of the package substrate, as shown in FIG. 6D-1, a via hole 609 is formed through the cavity region 608 to the second portion 602*b* of the package substrate 601. In one embodiment, for example, the via hole 609 is formed using laser ablation.

Then, as shown in FIG. 6E-1, at least one solder ball 611 is mounted within the via hole 609 of the cavity region 608, as a portion of a connector assembly 610 (will be discussed below).

Afterwards, as shown in FIG. 6F-1, a shielding layer 613-1 is formed on the regions other than the cavity region 608 of the encapsulant layer 607 to shield EMI induced to (or generated by) the semiconductor components 604 and the discrete components 605 encapsulated by the encapsulant layer 607.

Figures 1, 6G:
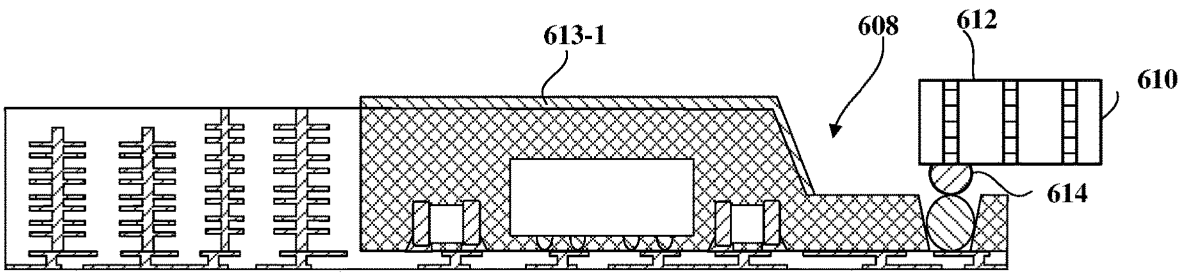
Figures 2, 6G:
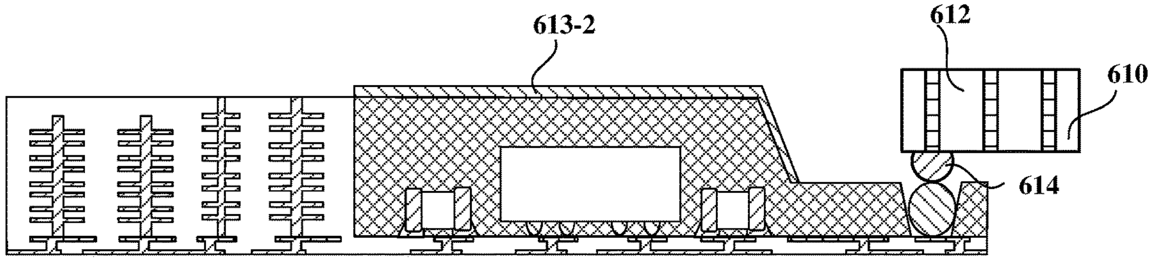

Then, as shown in FIG. 6G-1, a connector such as an e-bar 612 is further mounted onto and electrically coupled with the solder ball 611, for example, through another solder ball 614. The solder ball 611, the solder ball 614 and the e-bar 612 may constitute the connector assembly 610, for electrical connection with an external device. As such, the semiconductor package 600 can be formed.

Alternatively, in some embodiments, after the encapsulant layer 607 is formed on the second portion 602*b* of the package substrate, as shown in FIG. 6D-2, a shielding layer 613-2 is first formed onto the encapsulant layer 607. Afterwards, as shown in FIG. 6E-2, for example, an laser ablation may be performed on the encapsulant layer 607 and the shielding layer 613-2, to form the via 609 and at least a portion of the shielding layer 613-2. After the laser ablation, at least the regions other than the cavity region 608 of the encapsulant layer 607 is covered by the shielding layer 613-2, while at least the via 609 is exposed.

Then, as shown in FIGS. 6F-2 to 6G-2, the connector assembly 610 is mounted within the cavity region 608 of the encapsulant layer 607. Specifically, as shown in FIG. 6F-2, at least one solder ball 611 is mounted within the via hole 609 of the cavity region 608, as a portion of the connector assembly 610. Then, as shown in FIG. 6G-2, a connector such as the e-bar 612 is further mounted onto and electrically coupled with the solder ball 611, for example, through another solder ball 614. The solder ball 611, the solder ball 614 and the e-bar 612 may constitute the connector assembly 610, for electrical connection with an external device. The process is similar as that shown in FIGS. 6E-1 to 6F-1. As such, the semiconductor package 600 can also be formed.

Figure 7A:
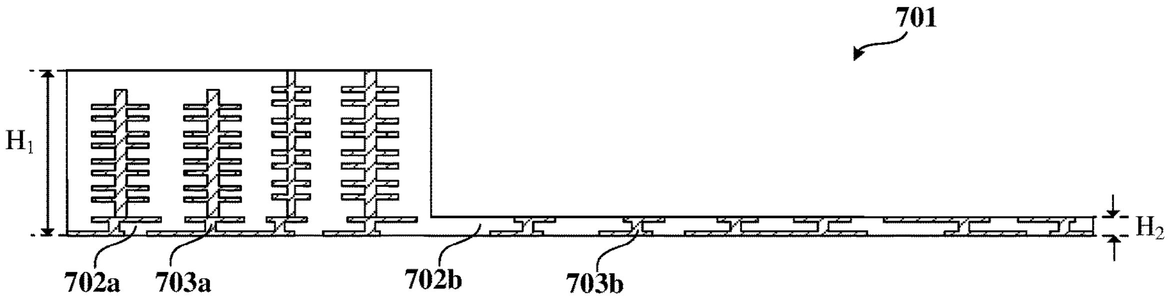
FIGS. 7A to 7F are cross-sectional views illustrating various steps for making a semiconductor package according to another embodiment of the present application.
Figure 7B:
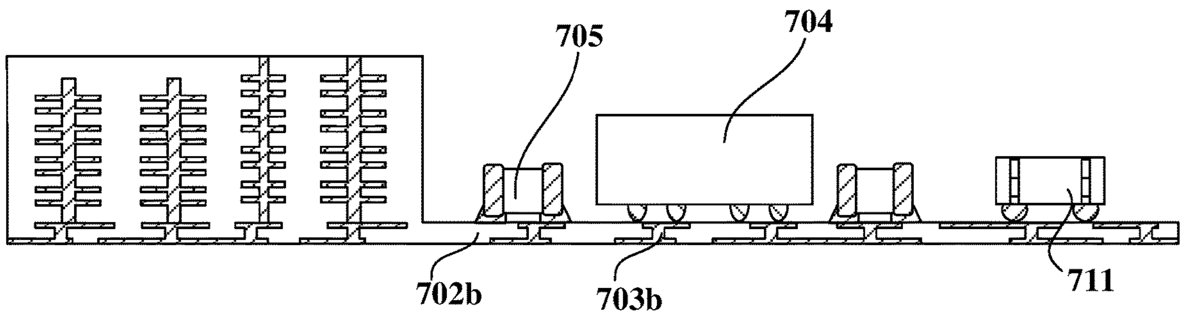
Figure 7C:
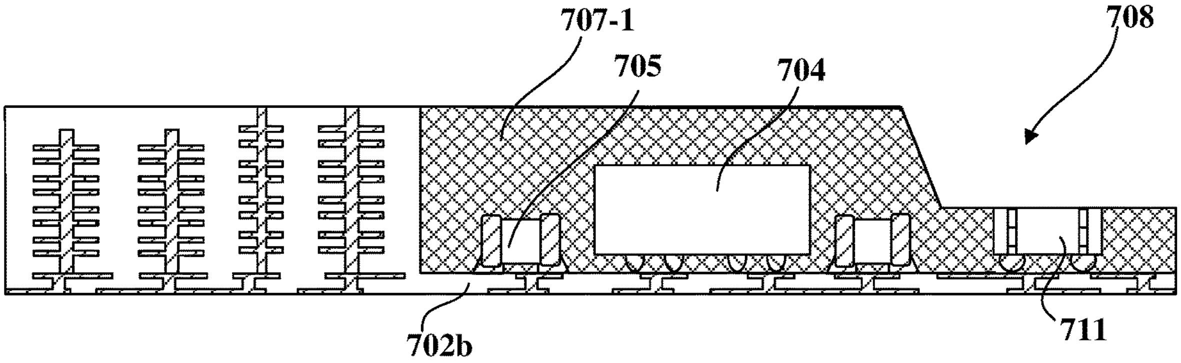
Figure 7D:
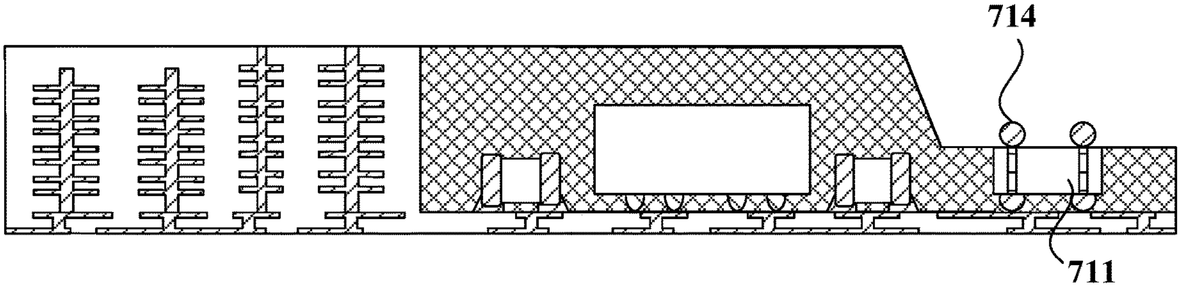
Figure 7E:
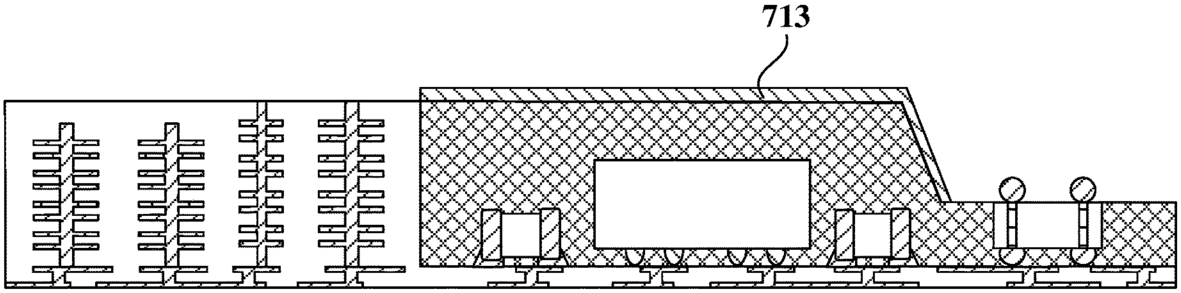
Figure 7F:
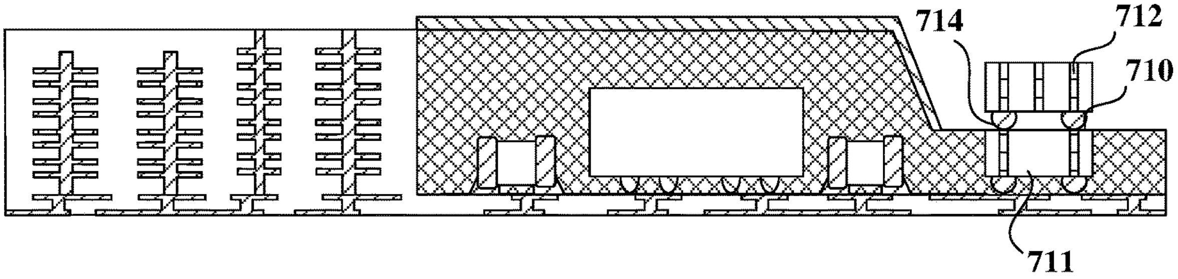

FIGS. 7A to 7F are cross-sectional views illustrating various steps for forming a semiconductor package 700 according to an embodiment of the present application. The steps of the method 500 will be discussed in detail with reference to FIGS. 7A to 7F. Those skilled in the art can understand an array of semiconductor packages 700 can be formed at the same time, and FIGS. 7A to 7F show how one semiconductor package 700 is formed. When forming the array of semiconductor packages 700, each semiconductor package 700 can be singulated from the array. For example, each semiconductor package 700 can be singulated from the array before a shielding layer 713 (as shown in FIG. 7F) is formed.

As shown in FIG. 7A, a package substrate 701 is first provided. The package substrate 701 includes a first portion 702*a*, a first conductive pattern 703*a*, a second portion 702*b* and a second conductive pattern 703*b*, which are similarly as those in FIG. 6A and thus will not be repeated here.

Then, as shown in FIG. 7B, at least one electronic component such as the semiconductor die 704 and the discrete component 705 is mounted on the second portion 702*b* of the package substrate 701. In addition to the electronic components 704 and 705, an e-bar connector 711 is also mounted on the second portion 702*b* of the package substrate 700 and is electrically coupled to the second conductive pattern 703*b*, as a portion of a connector assembly 710 which will be illustrated below.

Afterwards, as shown FIGS. 7C, an encapsulant layer 707 is formed on the second portion 702*b* of the package substrate 701, which covers the electronic components such as the semiconductor die 704 and the discrete component 705 mounted on the second portion 702*b* of the package substrate 701. In this embodiment, the portion of the encapsulant layer 707 encapsulating the e-bar connector 711 has a thickness substantially equal to that of the e-bar connector 711, thus exposing the e-bar connector 711 from the encapsulant layer 707. In some embodiments, the portion of the encapsulant layer 707 encapsulating the e-bar connector 711 has a thickness greater than that of the e-bar connector 711, thus covering the e-bar connector 711. In such embodiments, a laser ablation can be further applied to the encapsulant layer 707 to remove a portion of the encapsulant layer 707, so as to expose the e-bar connector 711 from the encapsulant layer 707. For example, the portion of the encapsulant layer 707 encapsulating the e-bar connector 711 may be thinned by the laser ablation to expose the e-bar connector 711; for another example, a via hole can be formed on the portion of the encapsulant layer 707 encapsulating the e-bar connector 711, like the via hole 609 shown in FIG. 6D-1, to expose the e-bar connector 711.

The portion of the encapsulant layer 707 encapsulating the semiconductor die 704 and the discrete component 705 has a greater thickness to allow for a full coverage of the semiconductor die 704 and the discrete component 705. As such, the cavity region 708 is formed in the encapsulant layer 707.

Then, as shown in FIG. 7D, one or more solder balls 714 can be mounted onto the e-bar connector 711, for electrically coupling the e-bar connector 711 to another connector to be formed.

Then, as shown in FIG. 7E, a partial shielding layer 713 is formed on the regions other than the cavity region 708 of the encapsulant layer 707.

Then, as shown in FIG. 7F, a connector, such an e-bar connector 712 is further mounted onto the e-bar 711 and electrically coupled with the e-bar connector 711 through the one or more solder balls 714. The e-bar connector 711, the solder balls 714 and the e-bar connector 712 may constitute the connector assembly 710, for electrical connection with an external device. Thus, the semiconductor package 700 is formed.

Figure 8:
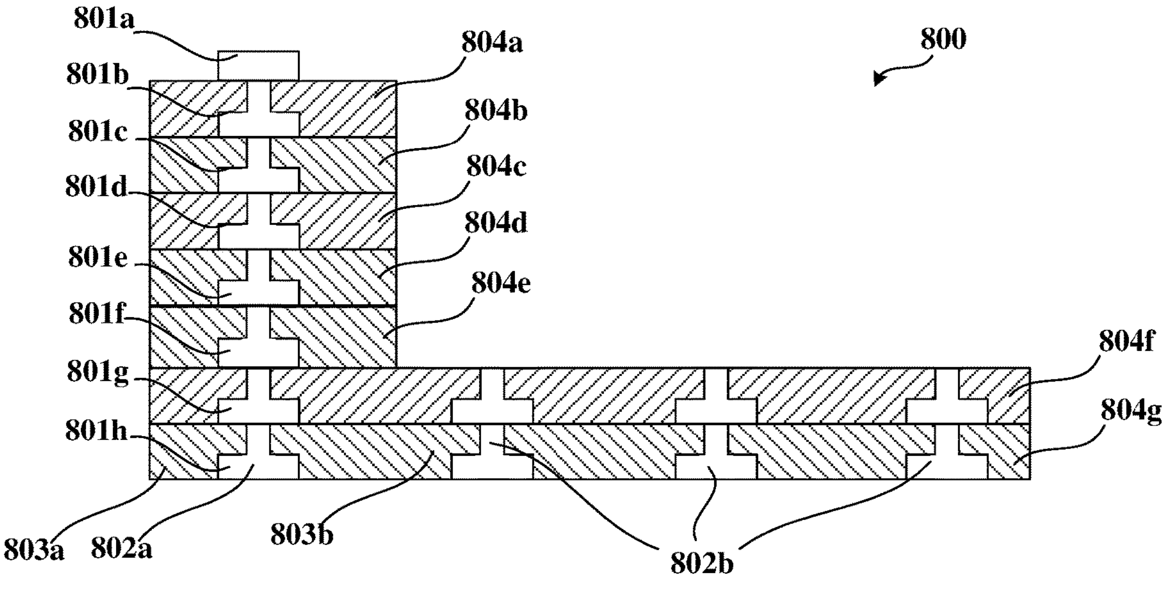
FIG. 8 is a cross-sectional view illustrating a package substrate according to an embodiment of the present application.

FIG. 8 is a cross-sectional view illustrating a package substrate 800 according to another embodiment of the present application. For example, the package substrate 800 may be used as the package substrate 101 shown in FIG. 1 or the package substrate 201 shown in FIG. 2.

As shown in FIG. 8, the package substrate 800 may be a multi-layer structure. The multi-layer structure may include multiple conducting layers 801*a* to 801*h*. The package substrate 800 may further include multiple insulating layers 804*a* to 804*g* that separate the multiple conducting layers 801*a* to 801*h*, respectively. The insulating layers may contain one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties.

The several conducting layers 801*a* to 801*h* may be patterned after deposition and further interconnected with each other through vias, to form a first conductive pattern

802a in a first portion 803a of the package substrate 800 and a second conductive pattern 802b of a second portion 803b of the package substrate 800.

It can be seen that the first portion 802a has a thickness greater than that of the second portion 802b, since some materials of the package substrate 800 is removed. The materials can be removed using the process shown in FIGS. 9A to 9I below, according to an embodiment of the present application.

Figure 9A:
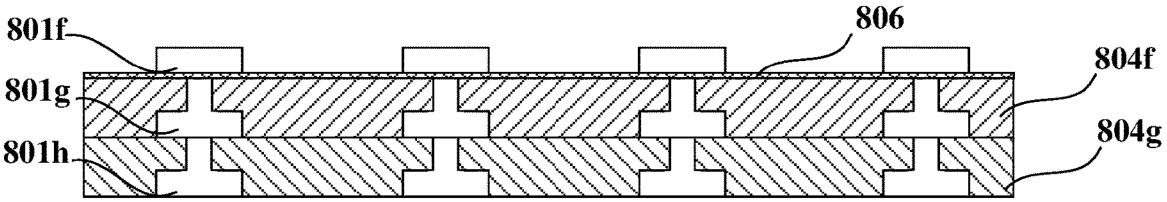
FIGS. 9A to 9I are cross-sectional views illustrating various steps of making a package substrate illustrated in FIG. 8 according to an embodiment of the present application.

As shown in FIG. 9A, the conducting layers 801f to 801h and the insulating layers 804f to 804g are laminated sequentially. In particular, a stopper layer 806 that is used later as a laser ablation stopper (will be illustrated below) is formed between the outer conducting layers 801f and the outer insulating layer 804f. In some embodiments, the stopper layer 806 may be a seed Cu layer.

Figure 9B:
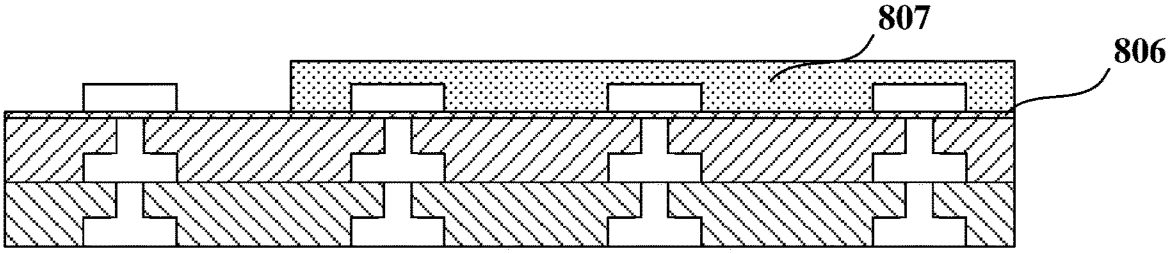
Figure 9C:
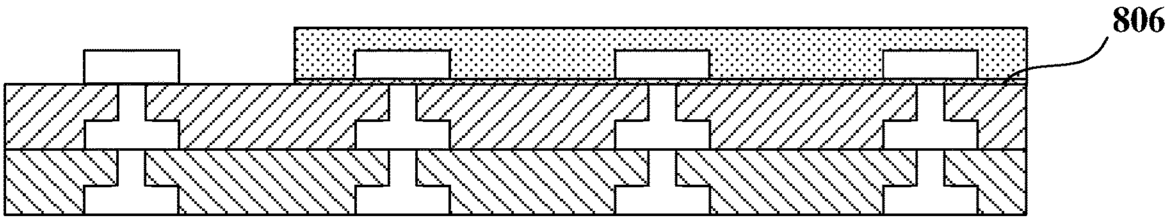

As shown in FIG. 9B, a mask layer 807 is formed on a portion of the stopper layer 806, which may be, for example, a photoresist layer. As shown in FIG. 9C, an etching process is applied to the stopper layer 806. As a result, the portion of the stopper layer 806 that is not covered by the mask layer 807 is removed. Due to the protection of the mask layer 807, the portion of the stopper layer 806 that is covered by the mask layer 807 is not removed. Then, as shown in FIG. 9D, the mask layer 807 is removed, and the portion of the stopper layer 806 that is not removed remains on the substrate.

Figure 9D:
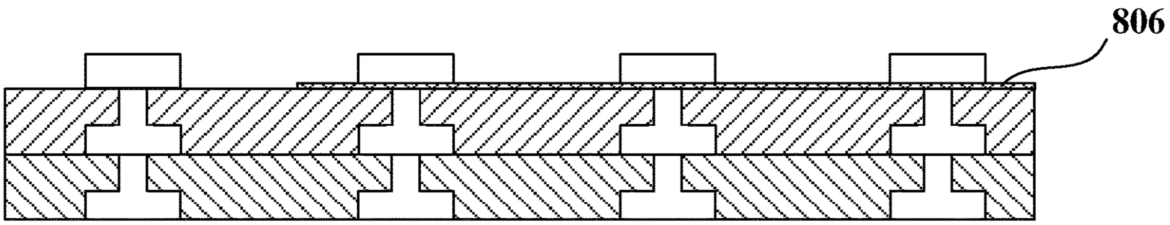
Figure 9E:
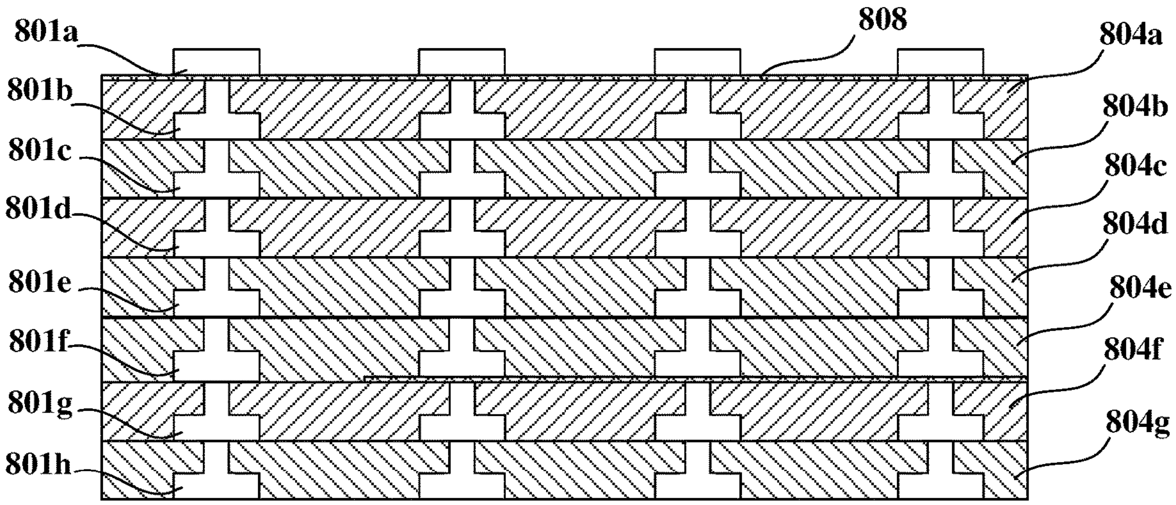

As shown in FIG. 9E, the conducting layers 801a to 801e and the insulating layers 804a to 804e are further laminated onto the conducting layers 801f to 801h and the insulating layers 804f to 804g. Similarly, a stopper layer 808 that is used later as a laser ablation stopper layer (will be illustrated below) is formed between the outer conducting layers 801a and the outer insulating layer 804a. In some embodiments, the stopper layer 808 may be a seed Cu layer.

Figure 9F:
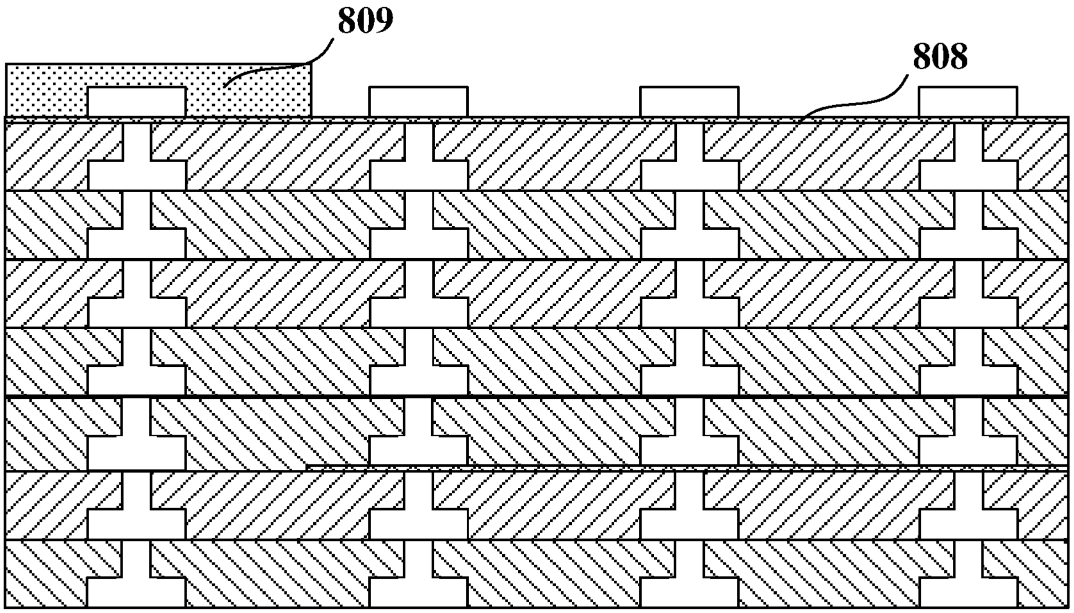
Figure 9G:
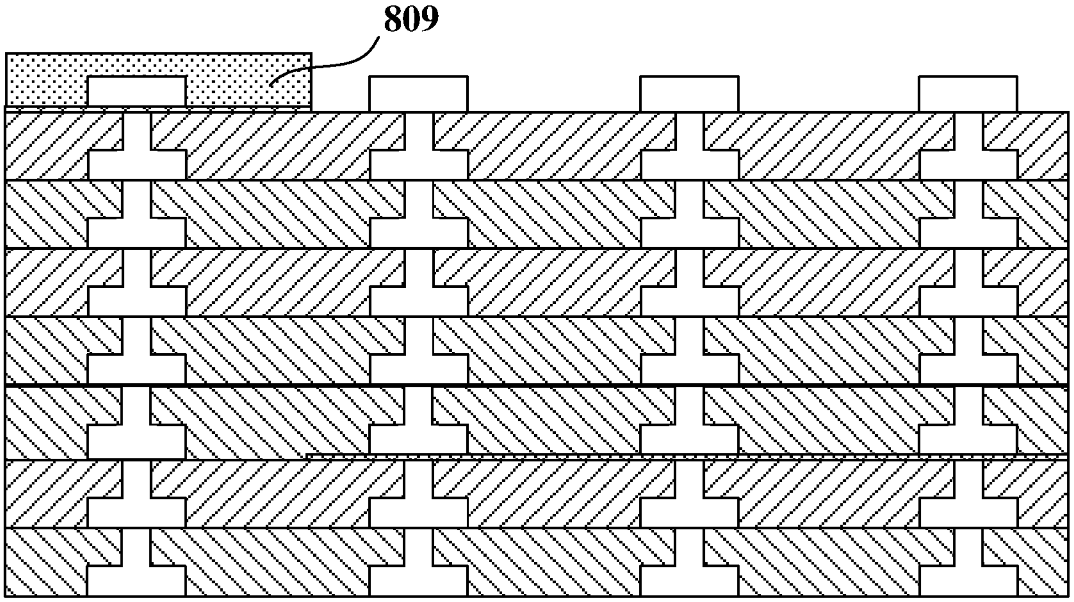
Figure 9H:
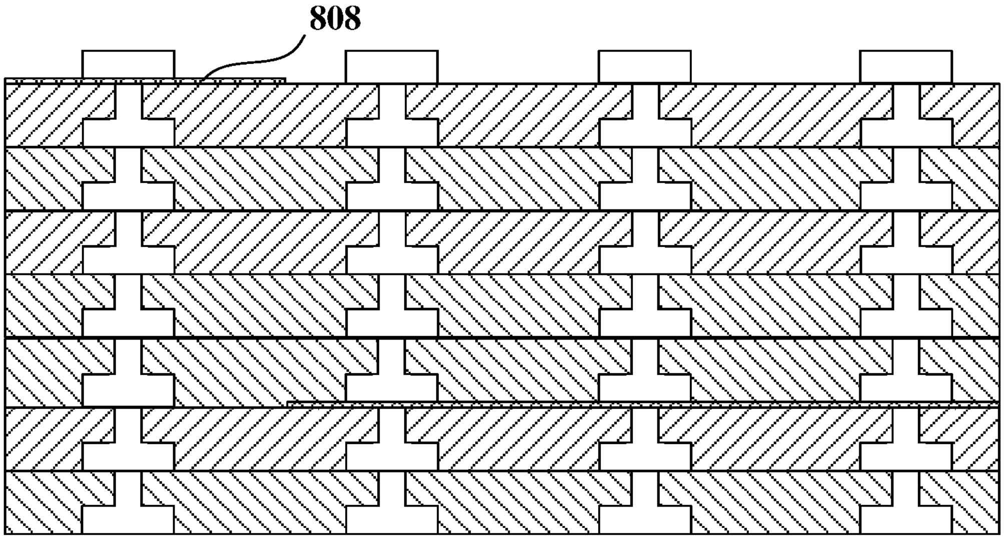

As shown in FIG. 9F to FIG. 9H, similarly as the process shown in FIG. 9B to FIG. 9D, another mask layer 809 is formed on a portion of the stopper layer 808, which may be, for example, a photoresist layer. An etching process is applied to the stopper layer 808, and the portion of the stopper layer 808 that is covered by the mask layer 809 remains on the substrate due to the protection of the mask layer 809. As a result, the stopper layer 806 and the stopper layer 808 are patterned as desired for providing protection for further laser process. In the embodiment, the patterned stopper layers 806 and 808 may be aligned at their closest edges, or partially overlap with each other, to avoid that the substrate 800 is etched through at some positions in the subsequent process.

Figure 9I:
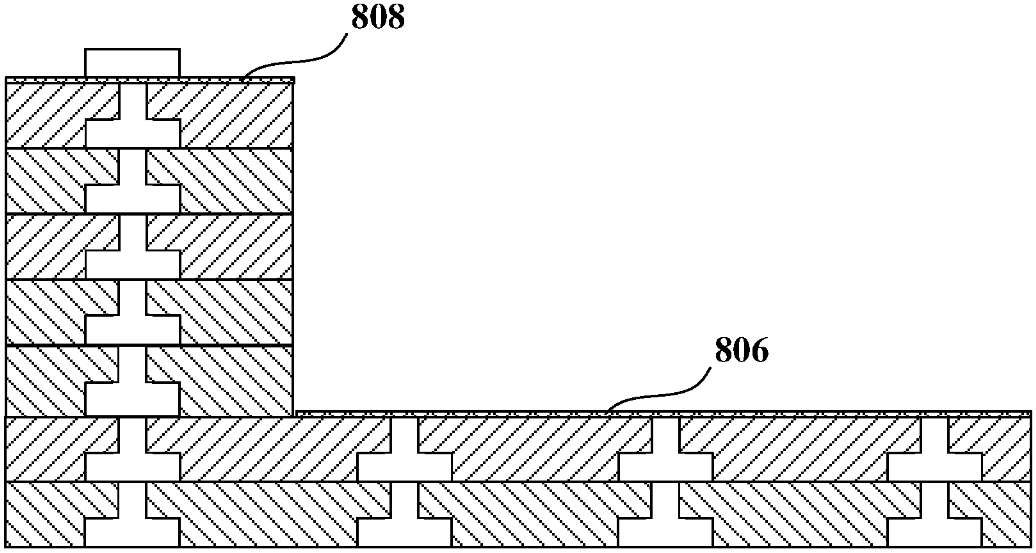

As shown in FIG. 9I, a portion of the substrate 800 is removed, for example, using laser ablation. Due to the stopper layer 806 and the stopper layer 808 that is patterned as shown in FIG. 9D and FIG. 9H, the portions of the substrate 800 that is covered by the stopper layer 806 and the stopper layer 808 are prevented from being removed. However, since the stopper layer 806 is lower than the stopper layer 808, more material is removed above the stopper layer 806 than above the stopper 808. Therefore, the substrate 800 is formed with a cavity that allows for further placement of various electronic components.

Afterwards, the stopper layer 806 and the stopper layer 808 can be removed, for example, through etching. Therefore, the package substrate 800 is formed.

Those skilled in the art can understand that, through the steps as illustrated in FIG. 9A to FIG. 9I, a package substrate can be processed to any desired form by patterning one or more stopper layers through one or more mask layers and etching. For example, those skilled in the art can understand that the steps illustrated in FIG. 9E to FIG. 9H generally are the same as the steps illustrated in FIG. 9A to FIG. 7D for patterning the stopper layer(s), and those steps can be repeated several times until a desired pattern of the stopper layer is formed within the substrate, so that when removing a portion of the substrate, for example, through laser, the desired pattern of the stopper layer can protect a desired portion of the substrate from the laser. Therefore, the portion of the substrate that is not protected by the desired pattern of the stopper layer can be removed from the substrate and the desired portion of the substrate is left, so as to manufacture a substrate that has a thinner portion at the top, at the bottom or at the side as desired.

The discussion herein included numerous illustrative figures that showed various portions of a semiconductor package and a method of forming the same. For illustrative clarity, such figures did not show all aspects of each example semiconductor package. Any of the example semiconductor packages and/or methods provided herein may share any or all characteristics with any or all other semiconductor packages and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A semiconductor package, comprising:

a package substrate, comprising:

a first portion comprising a first conductive pattern extending therewithin, wherein the first portion of the package substrate has a first thickness; and a second portion comprising a second conductive pattern extending therewithin, wherein the second portion of the package substrate has a second thickness smaller than the first thickness;

at least one electronic component mounted on the second portion of the package substrate and electrically coupled to the second conductive pattern;

an encapsulant layer formed on the second portion of the package substrate and covering the at least one electronic component, wherein the encapsulant layer comprises a cavity region;

a connector assembly formed within the cavity region of the encapsulant layer and electrically coupled to the second conductive pattern, wherein the connector assembly is exposed from the encapsulant layer to allow for electrical connection with an external device; and a partial shielding layer formed on at least regions other than the cavity region of the encapsulant layer.

2. The semiconductor package of claim 1, wherein the at least one electronic component has a top surface lower than that of the first portion of the package substrate.

3. The semiconductor package of claim 1, wherein the encapsulant layer is formed using a step molding process.

4. The semiconductor package of claim 1, wherein the package substrate is formed from a multi-layer structure that includes:

multiple conducting layers that form the first conductive pattern and the second conductive pattern; and multiple insulating layers that separate the multiple conducting layers.

5. The semiconductor package of claim 4, wherein the second portion of the package substrate is formed by removing a portion of the multi-layer structure.

6. The semiconductor package of claim 1, wherein the cavity region includes a via formed therethrough to the second portion of the package substrate, and the connector assembly includes at least one solder ball mounted in the via and electrically coupled to the second conductive pattern.

7. The semiconductor package of claim 1, wherein the semiconductor package further comprises an e-bar connector that is electrically coupled to the second conductive pattern.

8. The semiconductor package of claim 7, wherein the connector assembly includes at least one solder ball mounted on the e-bar connector.

9. The semiconductor package of claim 1, wherein the package substrate is of an integral structure.

10. The semiconductor package of claim 1, wherein the package substrate is of a non-integral structure, and the first portion is attached and electrically coupled to the second portion.

11. A method for forming a semiconductor package, comprising:

forming a package substrate that includes:

a first portion comprising a first conductive pattern extending therewithin, wherein the first portion of the package substrate has a first thickness; and a second portion comprising a second conductive pattern extending therewithin, wherein the second portion of the package substrate has a second thickness smaller than the first thickness;

mounting at least one electronic component on the second portion of the package substrate, wherein the at least one electronic component is electrically coupled to the second conductive pattern;

forming an encapsulant layer on the second portion of the package substrate, wherein the encapsulant layer includes a cavity region and covers the at least one electronic component;

mounting a connector assembly within the cavity region of the encapsulant layer, wherein the connector assembly is electrically coupled to the second conductive pattern and is exposed from the encapsulant layer to allow for electrical connection with an external device;

forming a partial shielding layer on at least regions other than the cavity region of the encapsulant layer.

12. The method of claim 11, wherein the at least one electronic component has a top surface lower than that of the first portion of the package substrate.

13. The method of claim 11, wherein the encapsulant layer is formed using a step molding process to form the cavity region.

14. The method of claim 11, the method further comprises:

forming a via through the cavity region to the second portion of the package substrate.

15. The method of claim 14, wherein mounting a connector assembly within the cavity region of the encapsulant layer comprises:

mounting at least one solder ball within the via as a portion of the connector assembly.

16. The method of claim 11, wherein mounting a connector assembly within the cavity region of the encapsulant layer comprises:

forming an e-bar connector on the second portion of the package substrate as a portion of the connector assembly, wherein the e-bar connector is electrically coupled to the second conductive pattern.

17. The method of claim 16, wherein mounting a connector assembly within the cavity region of the encapsulant layer comprises:

mounting at least one solder ball on the e-bar connector.

18. The method of claim 11, wherein the package substrate is formed from a multi-layer structure that includes:

multiple conducting layers that form the first conductive pattern and the second conductive pattern; and multiple insulating layers that separate the multiple conducting layers.

19. The method of claim 18, wherein the package substrate is formed through the following steps:

Step A: laminating a group of conducting layers and a group of insulating layers;

Step B: forming a stopper layer between an outer conducting layer of the group of conducting layers and an outer insulating layer of the group of insulating layers;

Step C: providing a mask layer that covers at least a portion of the stopper layer;

Step D: etching a portion of the stopper layer that is not covered by the mask layer;

Step E: removing the mask layer;

Step F: repeating the Step A to Step E until a desired pattern of the stopper layer is formed within the multi-layer structure;

Step G: removing at least a portion of the multi-layer structure that is not covered by the desired pattern of the stopper layer;

Step H: removing the stopper layer.

* * * * *